(12) United States Patent
Kim et al.

(10) Patent No.: US 8,044,351 B2
(45) Date of Patent: Oct. 25, 2011

(54) MICRO-COLUMN WITH SIMPLE STRUCTURE

(75) Inventors: Ho Seob Kim, Chonan-si (KR); Byeng Jin Kim, Incheon (KR)

(73) Assignee: Cebt Co. Ltd (KR)

( * ) Notice: Subject to any disclaimer, the term of this patent is extended or adjusted under 35 U.S.C. 154(b) by 0 days.

(21) Appl. No.: 11/915,679

(22) PCT Filed: May 29, 2006

(86) PCT No.: PCT/KR2006/002041
§ 371 (c)(1),
(2), (4) Date: Nov. 27, 2007

(87) PCT Pub. No.: WO2006/129940
PCT Pub. Date: Dec. 7, 2006

(65) Prior Publication Data
US 2008/0203881 A1    Aug. 28, 2008

(30) Foreign Application Priority Data

Jun. 3, 2005    (KR) .................. 10-2005-0047526

(51) Int. Cl.
*G21K 5/04* (2006.01)
(52) U.S. Cl. ........ 250/310; 250/306; 250/307; 250/311; 250/396 R; 250/396 ML
(58) Field of Classification Search ............. 250/306, 250/307, 310, 311, 396 R, 396 ML
See application file for complete search history.

(56) References Cited

U.S. PATENT DOCUMENTS

| | | | |
|---|---|---|---|
| 6,023,060 A | 2/2000 | Chang et al. | |
| 6,195,214 B1 * | 2/2001 | Muray et al. | 359/819 |
| 6,281,508 B1 | 8/2001 | Lee et al. | |
| 6,369,385 B1 * | 4/2002 | Muray et al. | 850/9 |
| 7,109,486 B1 * | 9/2006 | Spallas et al. | 250/311 |
| 7,230,251 B2 * | 6/2007 | Choi et al. | 250/396 R |
| 7,307,260 B2 * | 12/2007 | Choi et al. | 250/396 R |
| 7,329,878 B2 * | 2/2008 | Kim | 250/396 R |
| 2002/0125440 A1 * | 9/2002 | Gmur | 250/396 R |
| 2005/0087696 A1 * | 4/2005 | Choi et al. | 250/396 R |
| 2005/0199822 A1 * | 9/2005 | Saini et al. | 250/398 |
| 2005/0263712 A1 * | 12/2005 | Choi et al. | 250/396 R |
| 2006/0071175 A1 * | 4/2006 | Kim et al. | 250/396 R |

FOREIGN PATENT DOCUMENTS

| | | | |
|---|---|---|---|
| WO | WO 00/46831 A | | 8/2000 |
| WO | WO 00/67290 A | | 11/2000 |
| WO | WO 2004059690 A1 * | | 7/2004 |
| WO | WO 2005/010918 A1 | | 2/2005 |
| WO | WO2005/010918 A1 | | 2/2005 |

OTHER PUBLICATIONS

Thompson, et at ("Lens and deflector design for microcolumns" J. Vac. Sci. Technol. B 13(6) Nov./Dec. 1995, pp. 2445-2450).*

* cited by examiner

*Primary Examiner* — Michael Maskell
(74) *Attorney, Agent, or Firm* — John K. Park; Park Law Firm

(57) ABSTRACT

The present invention relates to an electron column including an electron emission source and lenses, and, more particularly, to an electron column having a structure that can facilitate the alignment and assembly of an electron emission source and lenses. The electron column having an electron emission source and a lens unit according to the present invention is characterized in that the lens unit includes two or more lens layers and performs both a source lens function and a focusing function. Furthermore, the electron column is characterized in that the lens unit includes one or more deflector-type lens layers and additionally performs a deflector function.

8 Claims, 4 Drawing Sheets

3-A

3-B

[Fig. 1]
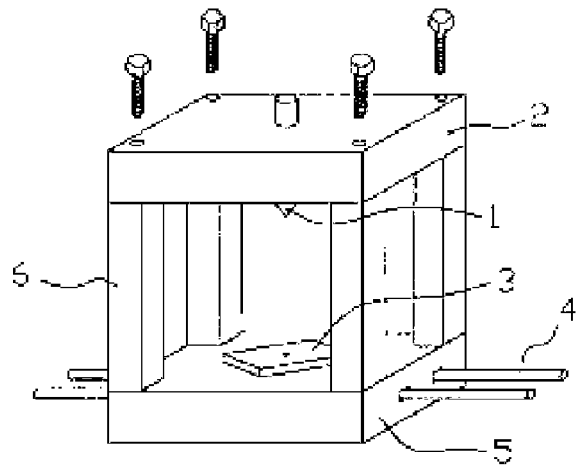
[Fig. 2]
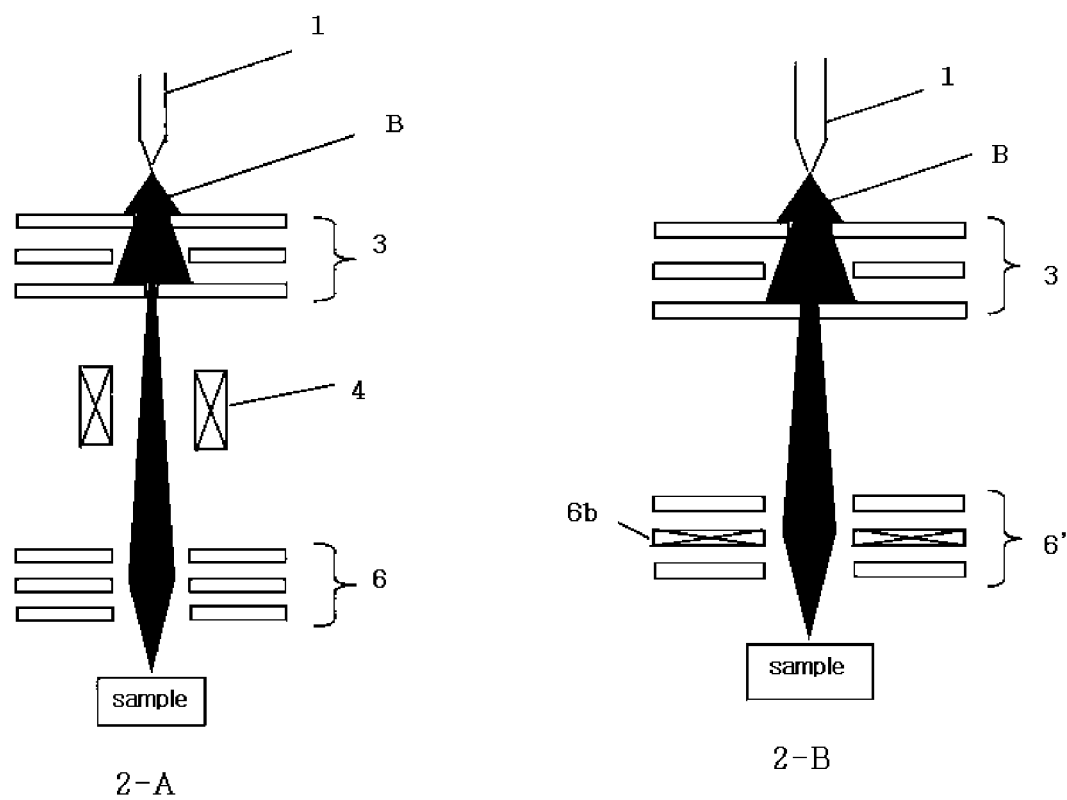
2-A         2-B

[Fig. 3]
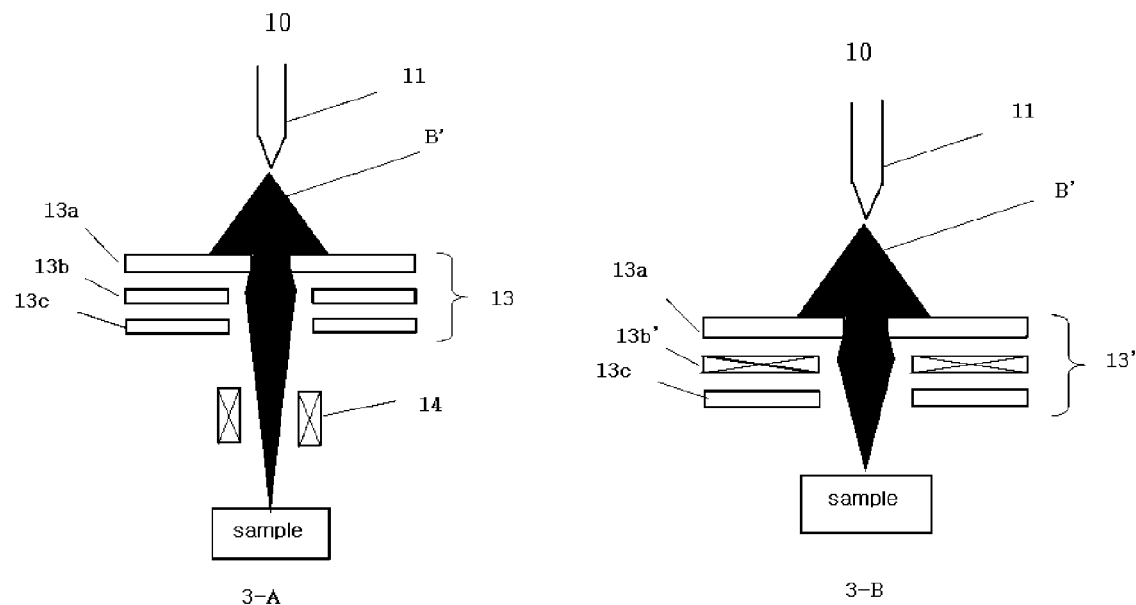
[Fig. 4]
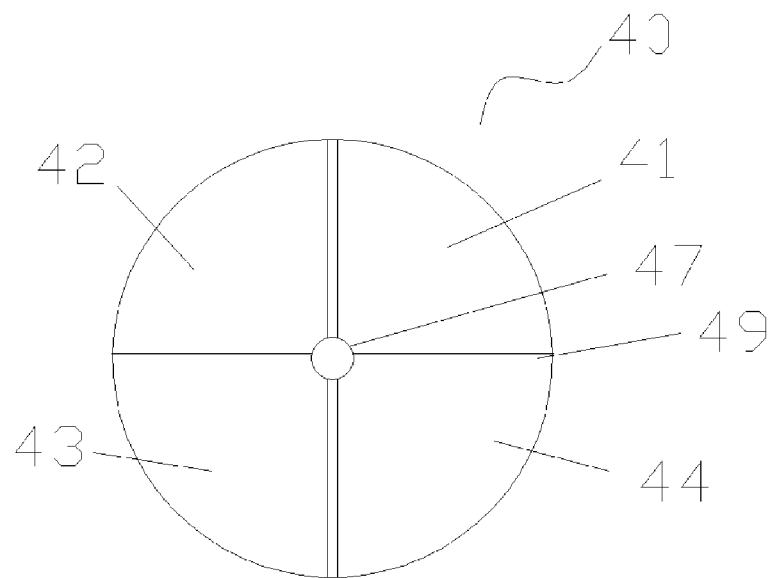

[Fig. 5]
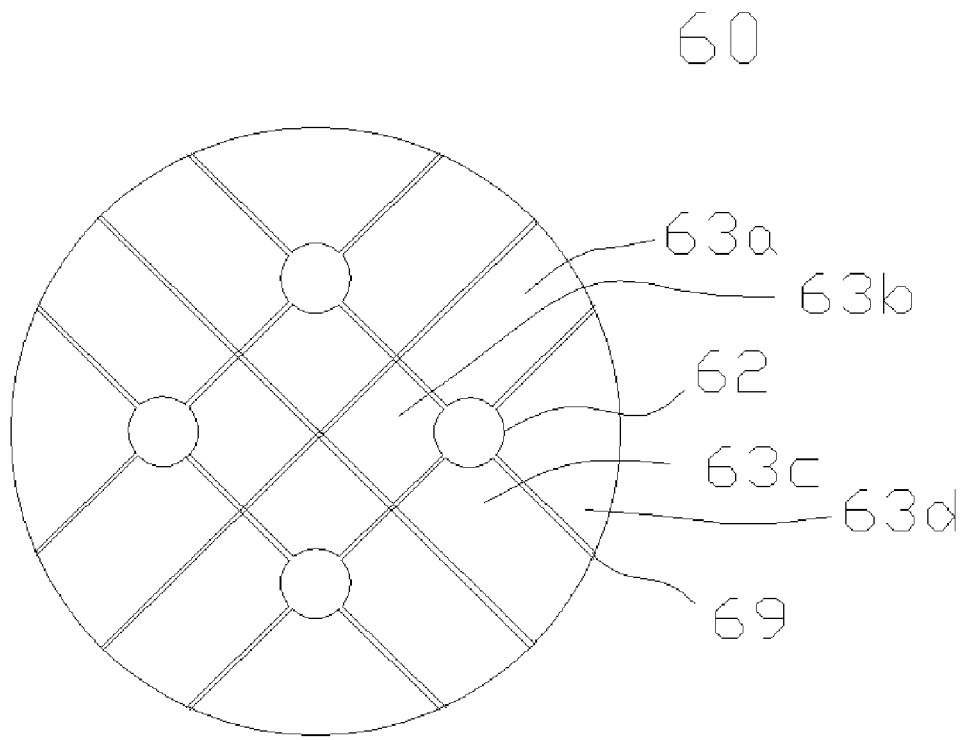
[Fig. 6]
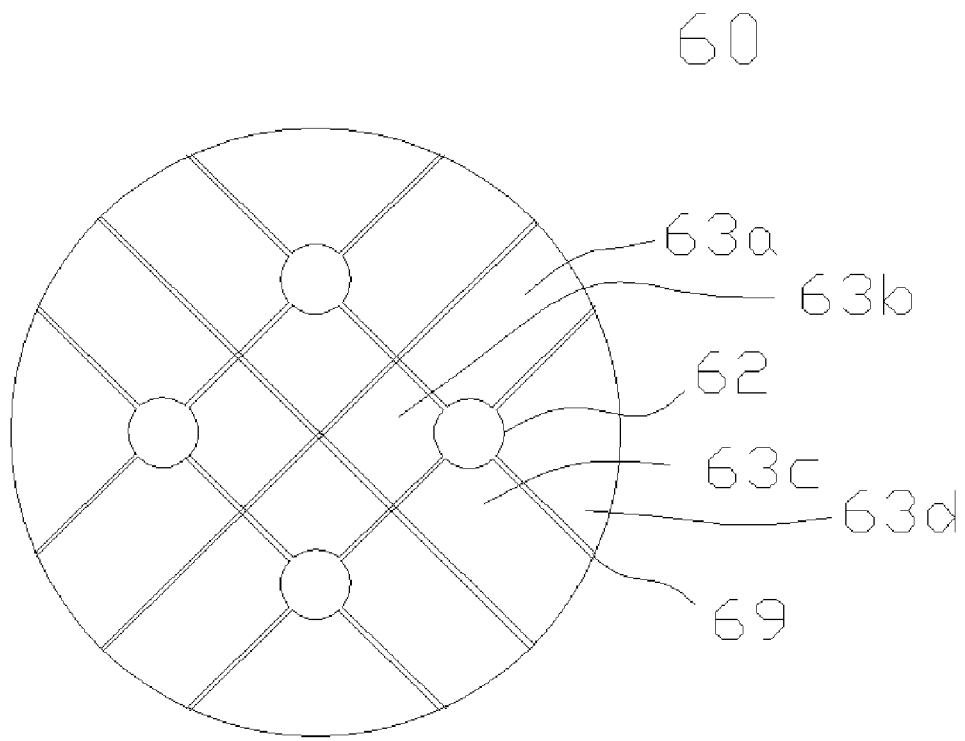

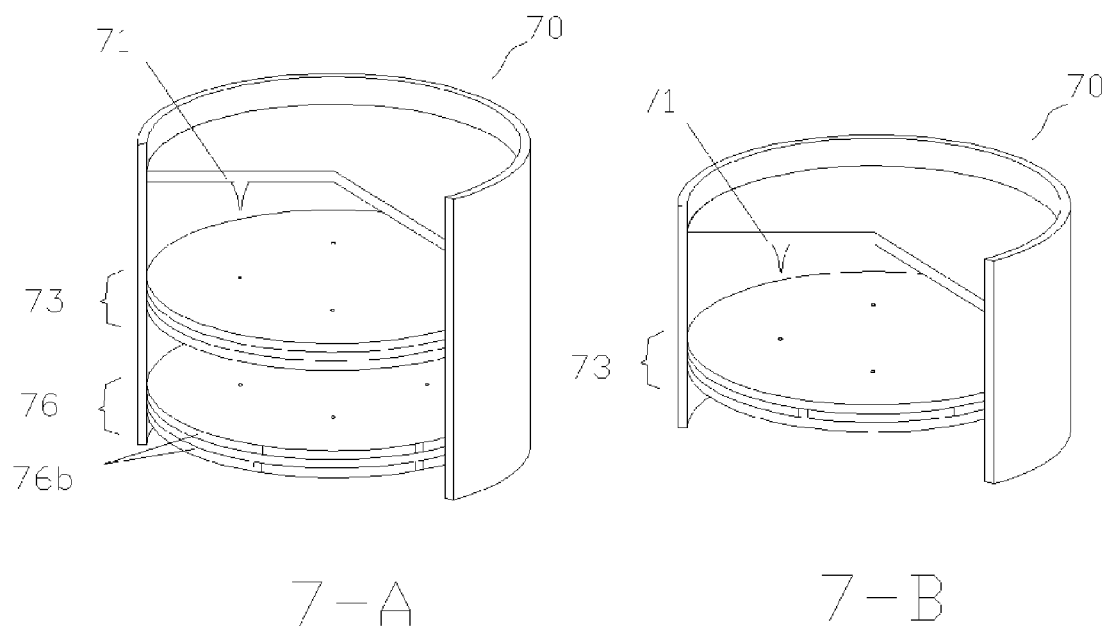
[Fig. 7]

MICRO-COLUMN WITH SIMPLE STRUCTURE

TECHNICAL FIELD

The present invention relates to a miniature electron column including an electron emission source and lenses, and, more particularly, to a miniature electron column having a structure that can facilitate the alignment and assembly of an electron emission source and lenses.

BACKGROUND ART

A microcolumn as a miniature electron column, which operates under the basic principle of a Scanning Tunneling Microscope (STM) and is based on an electron emission source and electro-optical parts having micro-structures, was first introduced in the 1980s. The microcolumn is fabricated by assembling micro-parts precisely, thereby minimizing optical numerical values and, therefore, constructing an improved electron column. A plurality of micro-structures is arranged and can be used for a multi-microcolumn having a parallel or series structure.

The microcolumn is a mechanical micro-structure that includes a micro-electronic lens and a deflector and has a high aspect ratio. In general, the microcolumn includes an electron emission source, a source lens, a deflector, and an Einzel lens.

For a microcolumn, the alignment and fastening of an electron emission source, a source lens and an Einzel lens are very important in the light of the performance of the microcolumn. With respect to such alignment and fastening of a microcolumn, a conventional microcolumn is disclosed in Journal of Vacuum & Science Technology B14 6, pp. 3792-3796, "Experimental evacuation of a 2020 mm footprint microcolumn", which was published in 1996.

FIG. 1 is a perspective view of a conventional microcolumn, which shows the conventional microcolumn in which an electron emission source, a source lens, deflectors and an Einzel lens are aligned and fastened. An upper plate 2, along with a micro-positioner (not shown) located on the top of the upper plate 2, forms a member for supporting the electron emission source, and a through hole is formed at the center of the member to position the electron emission source 1 therein. A lower plate 5 used as a support member for accommodating the upper plate 2 and the lenses, as shown in FIG. 1, is fastened using upper bolts via four support bars 6. The source lens 3 is aligned with the electron emission source 1 and is attached to the top of the lower plate 5 through epoxy bonding or the like. The deflectors 4 are arranged to the right and left of the lower plate 5. Furthermore, the Einzel lens (not shown) is assigned and fastened to the bottom of the lower plate 5 to be opposite the source lens 3 in the same manner as the source lens. The upper and lower plate 2 and 5 are respectively provided with through holes at the central axes thereof so that an electron beam emitted from the electron emission source 1 can pass through the lenses and the deflector.

FIG. 2 is a conceptual view showing the operation of conventional electron columns, which illustrates the concept of the operation of the conventional electron column.

In FIG. 2-A, an electron beam B emitted from the electron emission source 1 passes through the holes of a source lens 3, is deflected by a deflector 4, and is focused on a sample by a focus lens 6. The above-described conventional microcolumn is inconvenient in that the assembly and use thereof are inconvenient due to the wiring of the deflector 4 and the wiring of the focus lens 6. Furthermore, the associated procedure is complicated.

FIG. 2-B shows an embodiment in which a deflector is eliminated by performing both focusing and deflecting using a deflector-type lens layer. This technology is disclosed in Journal of Vacuum & Science Technology B13(6), pp. 2445-2449, "Lens and deflector design for microcolumn", and pp. 3802-3807, "The electrostatic moving objective lens and optimized deflection systems for Microcolumn", which was published in 1995.

In the electron column of FIG. 2-B, a focus lens 6' includes a deflector-type lens layer 6b, which will be described later (refer to the description of FIG. 4), in the central layer thereof, and performs focusing and deflector functions, instead of the deflector 4 of FIG. 2-A.

DISCLOSURE OF INVENTION

Technical Problem

Accordingly, the present invention has been made keeping in mind the above problems occurring in the prior art, and an object of the present invention is to provide an electron column having a simple structure that is formed by combining a deflector and a focus lens together.

In addition, the electron column of the present invention reduces the complexity of wiring, thereby simplifying processes.

In addition, the electron column of the present invention aims to simplify the wiring and control processes of a multiple electron column.

Technical Solution

An electron column having a simple structure according to the present invention basically includes an electron emission source, a source lens, and a deflector.

Furthermore, the present invention provides an electron column having an electron emission source and a lens unit, wherein the lens unit comprises two or more lens layers and performs both a source lens function and a focus lens function.

Furthermore, compared with the conventional microcolumn, the microcolumn according to the present invention source lens can additionally perform the function of a focus lens. Moreover, the source lens can perform both focusing and deflecting functions.

The structure of the microcolumn of the present invention uses microcolumn technology, which has already been developed (refer to [1] H. S. Kim, D. W. Kim, S. J. Ahn, Y. C. Kim, S. S. Park, S. K. Choi, D. Y. Kim, J. Korean Phys. Soc., 43 (5), 831, (2003), [2] E. Kratschmer, H. S. Kim, M. G. R. Thomson, K. Y. Lee, S. A. Rishton, M. L. Yu, S. Zolgharnain, B. W. Hussey, and T. H. P. Chang, J. Vac. Sci. Techno. B 14 (6), 3792 (1996), [3] T. H. P. Chang, M. G. R. Thomson, E. Kratschmer, H. S. Kim, M. L. Yu, K. Y. Lee, S. A. Rishton, and B. W. Hussey, J. Vac. Sci. Techno. B 14 (6), 3774 (1996)). An electron column generally includes an electron emission source configured to emit electrons, a source lens unit composed of three electrode lens layers and configured to control an electron beam and filter out part of the beam, two pairs of 8-pole deflectors for scanning the electron beam, and an Einzel lens or focus lens for condensing the electron beam. This structure is a basic structure for electron microscopes or lithography. Electron columns are not always fabricated to have such a structure. The overall length of an electron column is equal to or shorter than 3.5 mm, which is the overall length from an electron emission source to the last electrode of a focus lens. The electron column, which is significantly decreased in size compared to a conventional electron column, can maximize beam current and minimize various lens aberrations, thereby increasing resolution. Furthermore, since an electron beam is emitted using a low voltage of 1~2 kV, problems of space charging and electron-electron scattering, which occur when a voltage higher than 10 kV is used in the conventional art, can be solved. Such electron columns can be fabricated using silicon or metallic membranes when a previously developed semiconductor micro-fabrication technology is utilized.

Advantageous Effects

Since an electron column according to the present invention has no inherent focus lens, the structure thereof is simplified compared to that of the conventional electron column, so that wiring and control are facilitated and, for a multiple electron column, the fabrication of the electron column and the control of a lens are further simplified and facilitated.

BRIEF DESCRIPTION OF THE DRAWINGS

FIG. 1 is a perspective view of a conventional microcolumn;

FIGS. 2A and 2B are conceptual views showing the operation of conventional electron columns FIG. 3-A is a conceptual view showing an embodiment of the operation of an electron column according to the present invention FIG. 3-B is a conceptual view showing another embodiment of the operation of an electron column according to the present invention;

FIG. 4 is a plan view showing the deflector-type lens of the electron column that is used in the present invention;

FIG. 5 is a plan view showing an embodiment of the general lens of a multiple electron column that is used in the present invention FIG. 6 is a plan view showing an embodiment of the deflector-type lens of a multiple electron column that is used in the present invention FIG. 7-A is a cutaway perspective view showing an embodiment of the multiple electron column according to the present invention; and FIG. 7-B is a cutaway perspective view showing another embodiment of the multiple electron column according to the present invention.

MODE FOR THE INVENTION

With reference to the accompanying drawings, the microcolumn of the present invention is described in detail below.

FIG. 3 is a conceptual view showing embodiments of the operation of an electron column according to the present invention, which corresponds to the operation of the conventional electron column of FIG. 2. FIG. 4 is a plan view showing the lens layer of the source lens of the present invention, which additionally performs a deflector function.

In FIG. 3-A, an electron beam B' emitted from an electron emission source 11 passes through the holes of a source lens 13. The source lens 13 includes an upper lens layer 13a, a central lens layer 13b and a lower lens layer 13c. In this case, the upper lens layer 13a functions as an extractor and induces the emission of electrons from the electron emission source 11, while the central lens layer 13b performs both an accelerator function of accelerating electrons emitted from the electron emission source 11 and a focusing function. The lower lens layer 13c performs a focusing function, causes the electron beam B' to be focused on a sample as desired, and limits electrons emitted from the electron emission source 11 to form an effective electron beam. Furthermore, the electron beam focused as described above is deflected toward the sample by a deflector 14.

In FIG. 3-B, an electron beam B' emitted from an electron emission source 11 passes through the holes of a source lens 13'. Furthermore, the electron beam B' having passed through the source lens 13' is focused on a sample and deflected. The source lens 13' of FIG. 3-B includes an upper lens layer 13a, a central lens layer 13b' and a lower lens layer 13c. The electron column of FIG. 3-B is characterized in that a lens unit is composed only of a source lens and, particularly, the central lens layer 13b' is of a deflector type, therefore a simple electron column can be constructed using only three lens layers (electrodes). That is, using the deflector-type lens layer, an electron column including the lens unit having a simple structure can be fabricated. Furthermore, in the construction of FIG. 3-B, the entire source lens may be constructed using deflector-type lens layers, but it is preferred that only the necessary number of deflector-type layers be used because a deflective-type lens layer is complicated with respect to the wiring and control of the lens, compared to a general lens. In the electron column having the construction of FIG. 3-B, the upper lens layer 13a functions as an extractor and, therefore, induces the emission of electrons from the electron emission source 11, while the central lens layer 13b' performs both an accelerator function of accelerating electrons emitted from the electron emission source 11, and focusing and deflector functions. The lower lens layer 13c performs a focusing function, causes the electron beam B' to be well focused on a sample, and limits electrons emitted from the electron emission source 11 to form an effective electron beam.

The operation of the electron column according to the present invention, which is illustrated in FIG. 3, is configured such that a voltage difference is created between the lens layers (electrodes) of the source lens, and focusing can be additionally performed on the electron beam passing through the source lens.

The lens layer 40 of FIG. 4 is a lens layer that corresponds to a central one 13b, 13b' and 6b of 3 lens layers constituting the source lens 13 or focus lens 16, and additionally performs a deflecting function. In the lens layer 40 of FIG. 4, a single lens layer is divided into 4 regions, or electrodes 41, 42, 43 and 44. The 4 regions are insulated from each other by 4 insulating portions 49, therefore separate voltages can be respectively applied to the 4 regions 41, 42, 43 and 44. In this case, the insulating portions 49 are made of insulation material, or the lens layer is divided and fastened using Pyrex, with narrow space gaps being disposed therebetween, thus forming insulating portions only through the division.

In the above-described FIG. 3, only the central layer 13b' of the source lens 13' is formed of a deflector-type lens layer for deflection, however, all of the 3 layers may be formed of deflector-type lens layers. That is, the source lens can be constructed by selecting one or more deflector-type lens layers as one or more layers among the respective layers of the source lens. In general, the source lens or focus lens is formed of one or more lens layers, but the source lens unit according to the present invention requires two or more layers. By forming one or more of the layers using deflector-type lens layers, the operation of FIG. 3-B can be implemented.

Separate voltages are applied to the lens unit for respective lens layers. However, a number of different voltages equal to the number of deflecting regions is applied to the deflector-type lens, unlike voltages applied to general lens layers. Accordingly, the voltage that must be applied to a corresponding layer, plus or minus a deflection voltage for the deflection of a corresponding region, is applied to the deflector-type lens layer. Although, in the present embodiment, the deflector-type lens layer is divided into 4 regions and functions as a deflector, the deflector-type lens layer may be divided into 8 regions and used. The number of regions to be obtained through division may be determined according to need. Furthermore, although, in FIG. 3, the deflector is formed of a single layer, it may be formed of 2 or more layers and perform deflection.

FIGS. 5 and 6 are diagrams showing lens layers, respectively, that are used to construct source lenses using deflector-type lens layers of the present invention in a multiple electron column.

FIG. 5 shows a lens layer 50 for a general multi-ple electron column, not a deflector-type lens layer, and FIG. 6 shows a deflector-type lens layer 60. Like the source lens for the above single-type electron column, the source lens for the multiple electron column may be fabricated by combining the general multiple electron column lens layer of FIG. 5 with the multiple electron column lens layer of FIG. 6, or the source lens for a multiple electron column may be fabricated using only the lens layers 50 for a multiple electron column. That is, the lens may be constructed to have a construction identical or similar to the construction of the lens of the single-type electron column illustrated in FIG. 3. In FIG. 5, reference numerals 52 designate holes through which an electron beam can pass, and reference numerals 53 designate a single unit lens electrode. That is, reference numerals 53 correspond to each lens layer of a single-type electron column and the single unit lens electrode 53 encircles the hole 52.

FIG. 6 shows a deflector-type lens layer 60 for a multiple electron column, in which the deflector-type lens is fabricated as a multi-type using a method identical to that of FIG. 5. In FIG. 6, reference numerals 62 designate holes through which an electron beam can pass, and electrodes 63a, 63b, 63c and 63d correspond to each lens layer of a single-type electron column of a multi-type lens layer. Insulating portions 69 are identical to those of the lens layer of FIG. 4. The operation of respective layers is performed in such a way that separate voltages for deflection, in addition to basically necessary voltages, are applied to respective regions, like the operation of the deflector-type lens of the single-type electron column of FIG. 4. However, in order to operate respective deflectors in the multiple electron column, respective regions are separately wired based on the directions of the deflector-type lens, thus performing both a deflection function and the function of a corresponding lens layer. In the multiple electron column, wiring and voltage control can be further facilitated by applying the same voltage in each direction, according to the situation. In this case, the voltage that is obtained by adding a deflection voltage to the voltage necessary for the function of a corresponding lens layer, in consideration of the characteristics of an electron beam, is applied to each region in the same direction. For example, it is preferable to use data about the application of voltages for focusing and deflecting, or to use a voltage that is obtained by adding a deflection voltage to the corresponding voltage of the source lens for a corresponding region in each direction.

In FIGS. 5 to 7, each of the multiple electron columns is formed in a 2×2 arrangement composed of 4 single-type electron columns. However, the multiple electron column may be formed in various n×m arrangements in the same manner as described above.

The operation method thereof may be the same as that of the above-described single-type electron column. For the method of operating the multiple electron column, refer to Korean Patent Application No. 10-2004-0052102, entitled "Method for Controlling Electron Beam in Multi-microcolumn and Multi-microcolumn", which was filed on Jul. 5, 2004.

FIG. 7-A is a cutaway perspective view showing an embodiment of the multiple electron column according to the present invention, which illustrates the construction of the multiple electron column 70 according to the present invention. In FIG. 7-A, the multiple electron column according to the present invention includes a multi-type electron emission source 71, a source lens 73, and a deflector 76 including two deflector-type lens layers 76b. That is, the source lens 73 is formed of the lens of FIG. 5, and the deflector 76 and the electron emission source layer 71 are constructed using the lens layers of FIGS. 5 and 6, as shown in the drawing. Of the layers of the deflector 76, layers designated by reference numeral 76b are deflector-type lens layers 76b. The layer between the deflector-type lens layers 76b is intended to space the deflectors apart from each other, and is formed of an insulation layer having a shape identical to that of the lens layer of FIG. 5. FIG. 7-B is a cutaway perspective view showing another embodiment of the multiple electron column according to the present invention, which shows the multiple electron column having a simple construction identical to the above-described construction of FIG. 3-B, in which there is no separate deflector and the central layer 73b of the source lens 73 is formed of a deflector-type lens layer.

In this drawing, the source lens and the deflector are formed of combinations of lens layers. Although not described in detail, insulation layers may be interposed between respective lens layers and the coupling between the lenses is achieved using a conventional method.

The above-described source lens, in the present invention, functions as a conventional source lens and, at the same time, performs focusing. Although the term source lens is used to follow the conventional jargon, the source lens of the present invention must be distinguished from the conventional source lens.

INDUSTRIAL APPLICABILITY

The construction of the electron column according to the present invention is simplified, and a multiple electron column having a simple structure can be fabricated and used.

The invention claimed is:
1. An electron column comprising:
an electron emission source, and
a single lens for performing functions of a source lens, a focusing lens, and a deflector simultaneously,
wherein the lens consists of:
an upper lens layer configured to function as an extractor for inducing emission of electrons from the electron emission source;
a central lens layer configured to perform functions for focusing and deflecting electrons from the electron emission source; and
a lower lens layer configured to perform a focusing function that causes electron beam focused on a sample and limits electrons from the electron emission source so as to form an effective electron beam.
2. The electron column as set forth in claim 1, wherein the electron column is a multiple electron column.
3. The electron column as set forth in claim 2, wherein the multiple electron column is monolithically fabricated.
4. The electron column as set forth in claim 3, wherein the electron column is a multiple electron column.

5. The electron column as set forth in claim 4, wherein the multiple electron column is monolithically fabricated.

6. The electron column as set forth in claim 1, wherein the central lens layer of the single lens comprises one deflector-type lens layer, and the deflector-type lens layer is located between the upper and lower lens layers.

7. The electron column as set forth in claim 6, wherein the deflector-type lens layer comprises a plurality of regions all of which are bordering an electron-passing-through hole, and separate voltages are applied to each of the regions which are insulated from each other by insulating portions.

8. The electron column as set forth in claim 7, wherein the electron column is a multiple electron column.

* * * * *